Sept. 29, 1970 KAZUO WATANABE ET AL 3,531,723

CHASSIS CONSTRUCTION FOR TELEVISION RECEIVERS USING CIRCUIT BOARDS

Filed Oct. 12, 1966

2 Sheets-Sheet 1

INVENTORS
KAZUO WATANABE
AKIRA MATSUI

BY Darby & Darby

ATTORNEYS

INVENTORS
KAZUO WATANABE
AKIRA MATSUI

BY Darby & Darby

ATTORNEYS

United States Patent Office 3,531,723
Patented Sept. 29, 1970

3,531,723

CHASSIS CONSTRUCTION FOR TELEVISION RECEIVERS USING CIRCUIT BOARDS

Kazuo Watanabe, Osaka, and Akira Matsui, Osaka-fu, Japan, assignors to Sanyo Electric Co., Ltd., Moriguchi-shi, Japan, a corporation of Japan
Filed Oct. 12, 1966, Ser. No. 586,211
Claims priority, application Japan, Oct. 19, 1965, 40/64,310; Oct. 20, 1965, 40/86,126, 40/86,128; Nov. 6, 1965, 40/90,289
Int. Cl. H04b *1/08*
U.S. Cl. 325—355 4 Claims

ABSTRACT OF THE DISCLOSURE

A chassis construction for a television receiver in which various components of the television receiver circuit are mounted on circuit boards. Each circuit board has an electrical connector and a respective guide means and a connector are mounted on the chassis for receiving a circuit board and connecting its components into the television circuit. One of the circuit boards has a plate on which is mounted a heat producing element, the plate being in contact with the chassis which serves as a heat sink when the board is mounted to the chassis. In a preferred embodiment two other boards are mounted on opposite sides of a chassis wall with the wall serving as a shield. Also, a fourth board having components of the receiver horizontal deflection section thereon, is mounted beneath a housing containing other horizontal deflection components.

This invention relates to television receiver chassis construction, and more particularly to an arrangement for mounting circuit boards on a television receiver chassis.

In conventional television receivers, for example, of the transistorized type, a metal chassis is used on which circuit board assemblies are mounted by suitable members such as screws and the like. While such an arrangement is satisfactory from a construction point of view, it entails many manual operations in both assembling the receiver and servicing it at a later time. Of course, such manual operations are extremely time consuming and costly.

The present invention is directed to a simplified chassis construction for a television receiver in which a plurality of circuit boards are utilized on which respective sections of the receiver's electronic circuitry are mounted.

In accordance with the invention, a plurality of pairs of guide rails are mounted on the receiver chassis one pair of guide rails for each of the circuit boards. The guide rails are located so that the circuit boards can be readily mounted on or demounted from the chassis.

In a preferred embodiment of the invention, two circuit boards, for example, one containing the video intermediate frequency amplifier section of the receiver and the other containing the sound intermediate frequency amplifier section, are respectively mounted on separate pairs of rails above and below the chassis. Thus, the circuits of the two boards are completely shielded from each other. Also, in a preferred embodiment of the invention, one of the circuit board includes a heat-emitting transistor stage mounted on a metallic plate which plate can readily be placed into heat-conducting relationship with the chassis for heat dissipating purposes. The chassis of a preferred embodiment of the invention also includes a circuit board on which components for the horizontal deflection circuit are located, the board being directly under the protective case of the horizontal output transformer. This arrangement facilitates wiring of the receiver chassis. The case for the horizontal output transformer is also provided with novel heat-sink means for a cooperating transistor.

It is therefore an object of the present invention to provide an improved chassis construction for transistorized television receivers which permits ready assembly and servicing of the same.

Another object is to provide a television receiver chassis construction comprising a plurality of circuit boards which are mounted on guide rails located on the television chassis.

A further object is to provide a mounting arrangement for circuit boards on a television receiver chassis in which the circuits of the boards are effectively shielded from each other by the chassis.

An additional object is to provide improved television chassis construction in which a power transistor is mounted on a circuit board which is located in heat-dissipating relationship to the chassis.

Other objects and advantages of the present invention will become more apparent upon reference to the following specification and annexed drawings in which.

Figure 2:
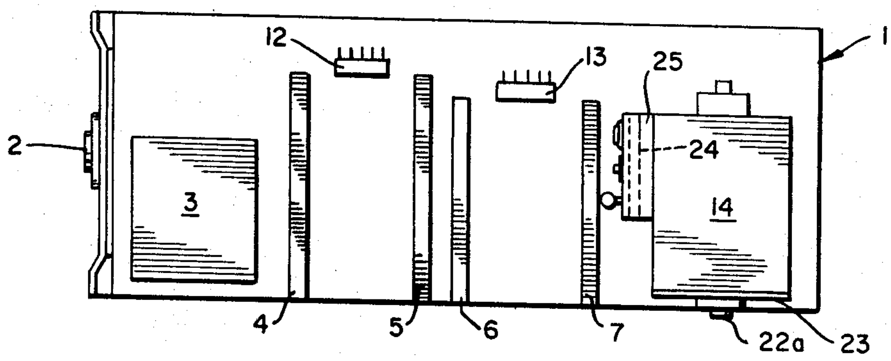
FIG. 2 is a top plan view of the embodiment of FIG. 1 with the circuit boards removed.
Figure 1:
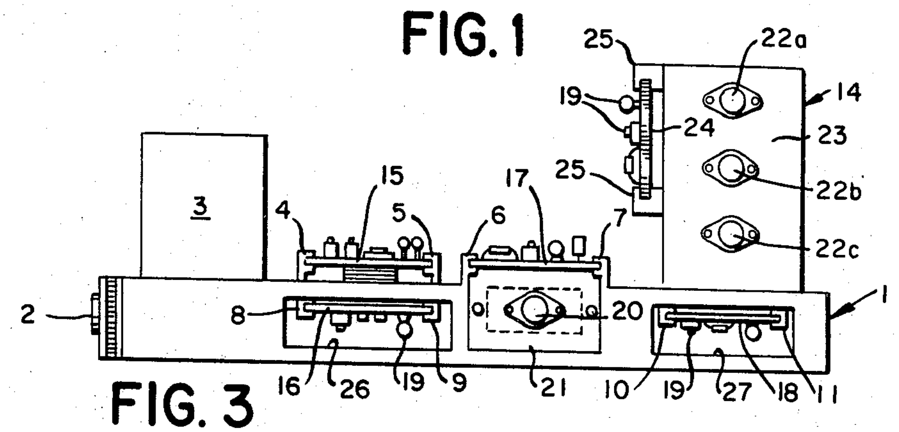
FIG. 1 is a rear view of a television receiver chassis with circuit boards assembled thereto, constructed in accordance with an embodiment of the present invention.

Referring first to FIGS. 1 and 2, a generally rectangular metallic chassis 1 for a television receiver has mounted on one side thereof the transistors or diodes 2 for the low-voltage power supply circuit adjacent a low voltage power transformer 3 mounted on the chassis top wall. Also mounted on the top of the chassis are two pairs of guide rails 4–5, and 6–7. A third pair of guide rails 8–9 is mounted on the underside of the chassis below rails 4–5 and is accessible through an aperture 26 in the rear (or front) wall of the chassis. Similarly, a fourth pair guide rails 10–11 is also mounted on the underside of the chassis under the protective casing 14 for the horizontal output transformer and is accessible through an aperture 27 in the rear (or front) wall of the chassis.

A respective electrical connector 12 and 13 is mounted at the end of each pair of guide rails 4–5 and 6–7. A respective electrical connector (not shown) is also mounted at the end of each of the rail pairs 8–9 and 10–11 on the underside of the chassis. The four connectors on the chassis may be either of the male or female type and connections and interconnections are made from them to various portions of the receiver circuits.

In FIG. 1, reference numerals 15, 16, 17 and 18 indicate respective circuit boards containing a plurality of components 19 thereon, such as transistors, resistors, capacitors, coils, etc. Each board preferably contains one section of the receiver circuitry thereon to permit easy assembly and troubleshooting for repair. Boards 15, for example, can have the video intermediate frequency amplifier section; board 16 the sound intermediate amplifier section; board 17 the vertical deflection section; and board 18 a portion of the horizontal deflection section.

A pair of tracks 25 are mounted on the side of the horizontal output transformer housing 14 with their channels in a substantially horizontal position to accommodate another circuit board 24. A connector (not shown) is also located on the housing 14 to interconnect the components of board 24 into the receiver.

Figure 3:
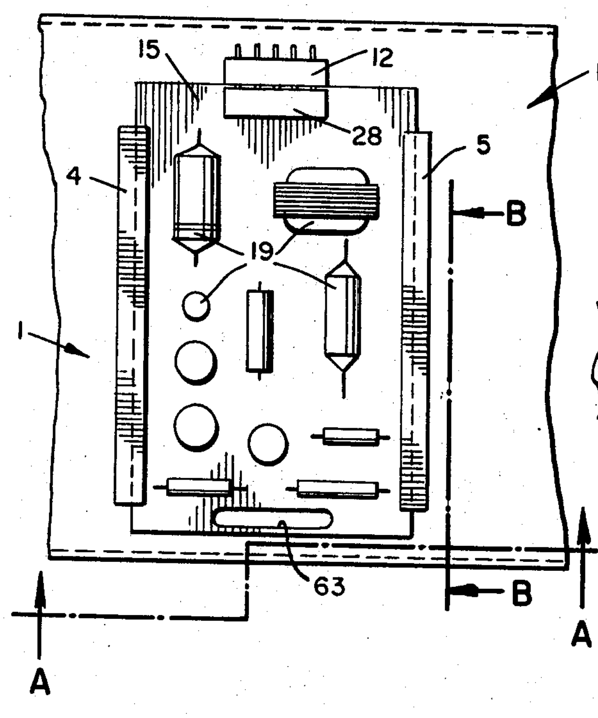
FIG. 3 is a top plan view of a portion of the receiver chassis of FIG. 1 with the circuit board thereon.
Figure 4:
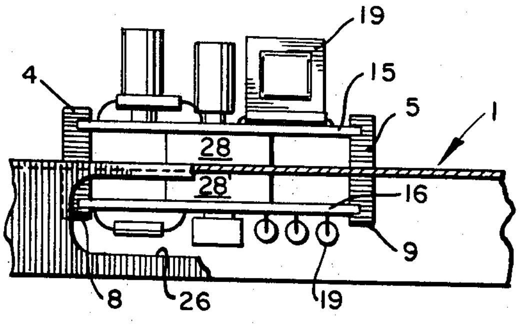
FIG. 4 is a cross-sectional view taken through lines A—A of FIG. 3.
Figure 5:
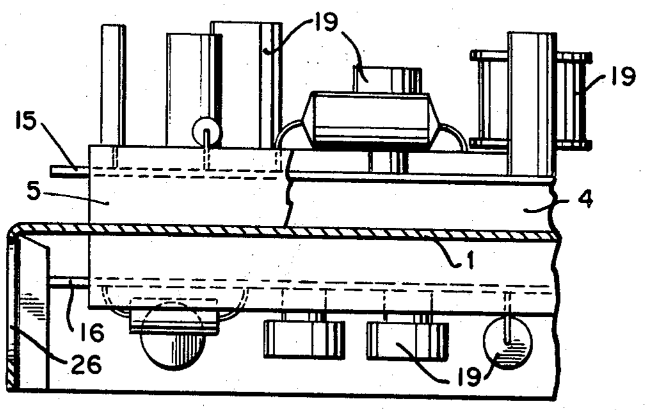
FIG. 5 is a cross-sectional view taken through lines B—B of FIG. 3.

As shown most clearly in FIG. 3, each of the circuit boards 15–18 and 24 has a respective connector mounted thereon, such as the connector 28 for board 15, at one end of the board. Each board's connector is electrically connected to the various components on the circuit board.

In the embodiment shown in FIGS. 1 and 2 and FIGS. 4–7, board 15, which for example holds the video intermediate frequency amplifier section, and circuit board 16, which for example holds the sound intermediate frequency amplifier stage, are stacked one above the other with the top wall of the metal chassis therebetween. The metal chassis serves as a shield to reduce undesired interference between both of said amplifier stages. This is shown more clearly in FIGS. 4–7.

Circuit board 18, which for example has a portion of the horizontal deflection section mounted thereon, is located under the housing 14 for the horizontal output transformer and associated circuits. Thus, it is quite convenient to connect the components on this circuit board to the components within housing 14.

Circuit board 17, which for example holds the vertical deflection section, is located between the circuit board 15 and the housing 14 so that connections can be readily made from the video amplifier stage, which produces the vertical synchronizing signals, on to the vertical deflection yoke.

It should be apparent from FIGS. 1–5, that circuit boards 15, 16, 17 and 18 and 24 are mounted on the chassis by inserting them in a respective pair of rails from the rear of the chassis. Each circuit board is pushed forward until its respective electrical connector mates with the corresponding stationary electrical connector on the receiver chassis. When it is necessary to repair or replace one or more components on a particular circuit board, it is only required that the circuit board be pulled tword the rear of the chassis, breaking the electrical connection between the two connectors.

In the circuit board shown in FIG. 3, a small cut out 63 is provided on a circuit board so that it can be easily grasped and moved.

Figure 6:
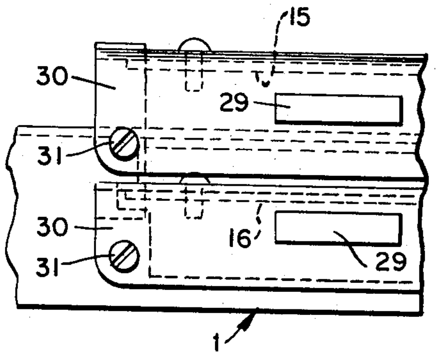
FIG. 6 is a rear view of a portion of the chassis with circuit boards assembled thereto in accordance with another embodiment of the invention.
Figure 7:
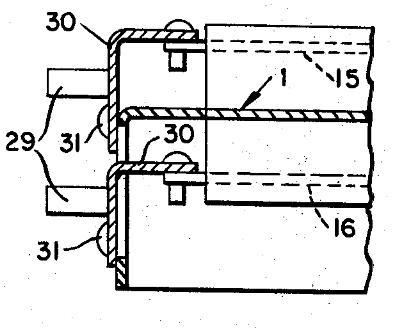
FIG. 7 is a side-elevational view of the embodiment of FIG. 6.

In the embodiment shown in FIGS. 6 and 7, circuit boards 15 and 17 are shown having generally L-shaped angle members 30 with small handles 29 formed thereon at the rear edges. After the circuit boards are inserted in the chassis they are secured thereto by screws 31, one at each end of the angle 30.

Figure 8:
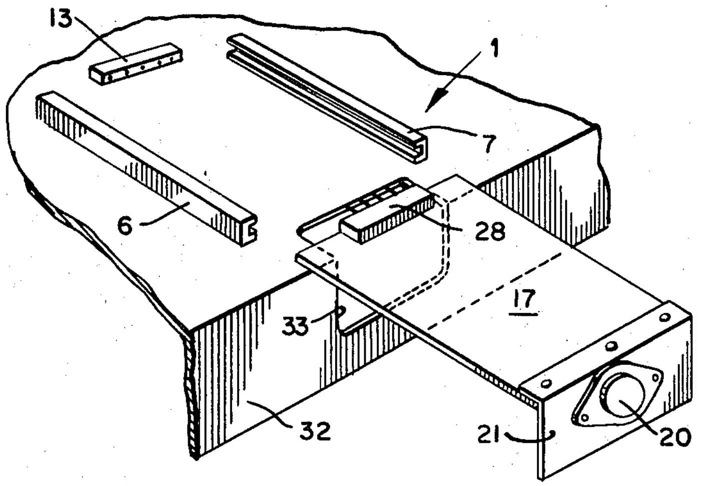
FIG. 8 is a perspective view showing the details of the heat sink arrangement of one of the circuit boards.

FIG. 8 shows the details of the circuit board 17 which, for example, holds the vertical deflection section. This circuit board includes an L-shaped metal heat sink plate 21 which is attached to the rear end of the circuit board 17. The major portion of plate 21 extends parallel to the back wall 32 of the chassis. A power transistor 20 for the vertical deflection circuit is mounted on the heat sink plate.

Connections (not shown) are made from the transistor 20 to the connector 28 on the front end of the circuit board. The board 17 is inserted into the guide rails 6 and 7 and pushed forward until the terminals of its connector 28 engage the terminals of connector 13 mounted on the chassis. Connector 13 is located so that the heat sink plate 21 is in contact with the rear wall of the metal chassis when the board 17 is fully assembled to the chassis. When this is done, the heat of the transistor 20 has the plate 21 as a sink as well as the entire chassis. An aperture 33 is provided in the wall of the chassis so that the terminals (not shown) on the bottom of transistor 20 will not be shorted out.

Figures 9, 10:
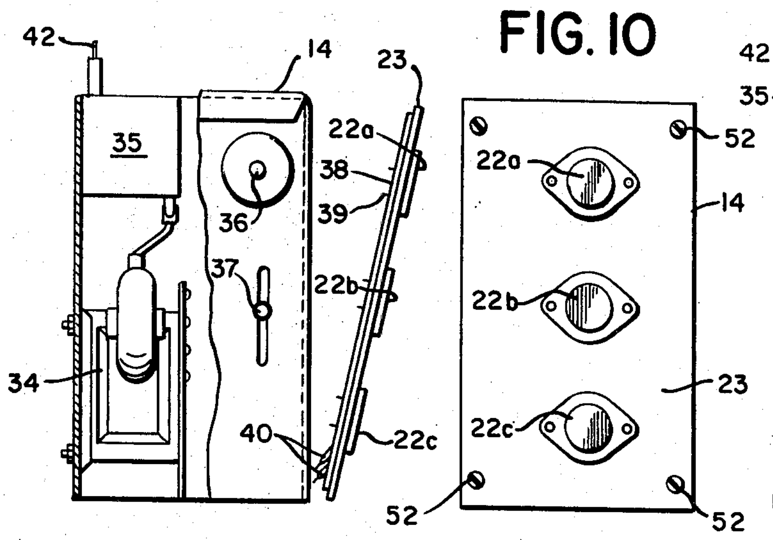
FIG. 9 is a side-elevational view, partially broken away, of a horizontal output transformer protective case and cover therefor, with power transistors being mounted on the cover.
FIG. 10 is a side-elevational view of the cover plate and mounted power transistors for the embodiment of FIG. 9.
Figure 11:
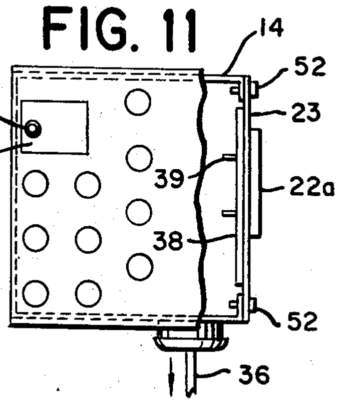
FIG. 11 is a top-plan view of the transformer case of FIG. 9.

FIGS. 9–11 show the details of the horizontal deflection circuit components on housing 14. Housing 14 has the high-voltage transformer 34 mounted therein together with the high-voltage rectifier (not shown) located under a shield 35. Reference numeral 36 indicates a connector for a lead wire which supplies current to a horizontal deflection yoke (not shown). A lead wire 42 is provided for supplying high voltage to the anode of a cathode ray tube (not shown). The lever 37 is used to adjust the width of the picture of the picture displayed on the receiver cathode ray tube.

As shown in FIGS. 9–11, a plurality of transistors 22*a* through 22*c*, which normally cooperate with the other components on the circuit board 24, or in housing 14, are mounted on a metal heat sink plate 23 in thermo-conductive contact therewith. The plate 23 serves as the back cover for the housing 14 and is held thereto by the screws 52.

As shown in FIG. 9, a circuit board 38 of insulating material is mounted on the inner side of the cover plate 23 and the electrodes of the transistors 22 are connected thereto. The output wires of the circuit board 38 and the transistors 22 are brought out through the lead wires 40 which are connected to components inside of the housing 14. As should be clear, when the cover plate 23 is fastened to the housing 14, the transistors 22 not only have the cover plate 23 as a heat sink, but also the entire housing 14, which is also in heat conductive relationship with the chassis 24. Thus, an effective heat sink is provided for the transistors 22.

While preferred embodiments of the invention have been described above, it will be understood that these are illustrative only, and the invention is limited solely by the appended claims.

What is claimed is:

1. A chassis construction for a television receiver comprising a plurality of circuit boards, electronic circuit means and first electrical connector means mounted on each of said circuit boards, a metal chassis, a plurality of guide means each for receiving and holding a respective circuit board mounted on said chassis, a respective second electrical connector means mounted on said chassis to mate with said first connector means on said respective circuit board, one of said circuit boards having a metal plate and a heat producing circuit element mounted on said metal plate, said metal plate being in heat conductive relationship to the chassis when its circuit board is mounted thereon in its respective guide means so that the chassis dissipates the heat of said heat producing element.

2. The chassis construction of claim 1 wherein each said circuit board is inserted into its respective guide means from the rear of the chassis toward the front of the chassis and is removable from the rear of the chassis.

3. The chassis construction of claim 1 wherein said plurality of circuit boards includes two other circuit boards, said guide means and the respective second electrical connector for said two other boards being mounted on opposite sides of one wall of the chassis, the portion of the chassis intermediate the two other circuit boards mounted therein shielding the electronic circuit means of said two circuit boards from each other.

4. The chassis construction of claim 2 wherein the chassis has at least one side wall and the guide means for another circuit board and its respective electrical connector is mounted beneath another wall of the chassis, said side wall being formed with an aperture to provide access to said guide means for insertion and removal of said other circuit board.

References Cited

UNITED STATES PATENTS

| | | | |
|---|---|---|---|
| Re. 25,317 | 1/1963 | McCoy | 325—355 XR |
| 2,628,270 | 2/1953 | Himmel | 325—355 XR |
| 3,014,161 | 12/1961 | Tarczy-Hornoch | 325—355 XR |
| 3,376,920 | 4/1968 | Lazarus et al. | 165—80 |

ROBERT L. GRIFFIN, Primary Examiner

R. S. BELL, Assistant Examiner

U.S. Cl. X.R.

178—7.9; 317—101; 325—357